(12) United States Patent
Jin et al.

(10) Patent No.: US 9,584,306 B2
(45) Date of Patent: Feb. 28, 2017

(54) PHASE DETECTION IN AN ANALOG CLOCK DATA RECOVERY CIRCUIT WITH DECISION FEEDBACK EQUALIZATION

(71) Applicant: ALTERA CORPORATION, San Jose, CA (US)

(72) Inventors: Wenyi Jin, San Jose, CA (US); Jihong Ren, Sunnyvale, CA (US); Hae-Chang Lee, Los Altos, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/743,870

(22) Filed: Jun. 18, 2015

(65) Prior Publication Data

US 2016/0373241 A1    Dec. 22, 2016

(51) Int. Cl.
| | |
|---|---|
| H03H 7/30 | (2006.01) |
| G06K 9/32 | (2006.01) |
| H04L 7/00 | (2006.01) |
| H04L 25/03 | (2006.01) |
| H03M 3/02 | (2006.01) |

(52) U.S. Cl.
CPC ............. *H04L 7/0058* (2013.01); *H03M 3/02* (2013.01); *H04L 7/0087* (2013.01); *H04L 25/03057* (2013.01)

(58) Field of Classification Search
CPC ................. G09G 2300/0426; G09G 2370/16; G09G 2310/08; G09G 5/10; G09G 2320/0666; G09G 5/377
USPC .......................................... 375/229; 382/300
See application file for complete search history.

(56) References Cited

U.S. PATENT DOCUMENTS

| | | | |
|---|---|---|---|
| 5,471,411 A * | 11/1995 | Adams | H03H 17/0628 708/300 |
| 7,149,914 B1 | 12/2006 | Asaduzzaman et al. | |
| 7,366,267 B1 | 4/2008 | Lee et al. | |
| 7,394,898 B1 * | 7/2008 | Inoue | H04M 9/082 379/406.02 |
| 7,839,966 B1 | 11/2010 | Masepohl | |
| 8,188,901 B1 * | 5/2012 | Inamdar | H03M 3/02 341/133 |
| 8,520,724 B2 * | 8/2013 | Kossel | H04L 25/03343 375/229 |
| 8,837,571 B1 | 9/2014 | Ke et al. | |
| 2002/0067677 A1 * | 6/2002 | Miyashita | G11B 20/10009 369/59.16 |
| 2004/0213341 A1 * | 10/2004 | Fimoff | H04L 25/03063 375/233 |

(Continued)

*Primary Examiner* — Daniel Washburn
*Assistant Examiner* — Sarah Hassan
(74) *Attorney, Agent, or Firm* — Okamoto & Benedicto LLP (57) ABSTRACT

An embodiment of the invention relates to a method of phase detection in a receiver circuit with decision feedback equalization. Partial-equalization and full-equalization edge signals are generated. The feedback from the first tap of the decision feedback equalizer is separated from the feedback of the remaining plurality of taps. The feedback from the plurality of taps (not including the first tap) is used to generate partial-equalization edge signals, while the feedback from all the taps is used to generate full-equalization edge signals. The partial-equalization and full-equalization edge signals are utilized by phase-detection circuitry to provide highly-accurate data sampling locations for improved performance.

16 Claims, 9 Drawing Sheets

(56) References Cited

U.S. PATENT DOCUMENTS

| | | | |
|---|---|---|---|
| 2005/0094900 A1* | 5/2005 | Abe | G06T 7/0083 |
| | | | 382/300 |
| 2005/0123077 A1* | 6/2005 | Kim | H04L 25/03254 |
| | | | 375/342 |
| 2006/0255879 A1* | 11/2006 | Heston | H03G 11/025 |
| | | | 333/81 R |
| 2008/0320068 A1* | 12/2008 | Bowling | H03H 17/06 |
| | | | 708/300 |
| 2011/0142120 A1* | 6/2011 | Liu | H04L 25/03057 |
| | | | 375/233 |

* cited by examiner

| A | T1 | B | UP1 | DN1 |
|---|----|---|-----|-----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 1 | 0 |
| 1 | 0 | 1 | 0 | 1 |
| 1 | 1 | 0 | 0 | 1 |
| 1 | 1 | 1 | 0 | 0 |

| B | T2 | C | UP2 | DN2 |
|---|----|---|-----|-----|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 1 | 0 |
| 1 | 0 | 1 | 0 | 1 |
| 1 | 1 | 0 | 0 | 1 |
| 1 | 1 | 1 | 0 | 0 |

FIG. 5A

| UP1 | DN1 | UP2 | DN2 | UP | DN |
|-----|-----|-----|-----|----|----|
| 0 | 0 | 0 | 0 | 0 | 0 |
| 0 | 0 | 0 | 1 | 0 | 1 |
| 0 | 0 | 1 | 0 | 1 | 0 |
| 0 | 1 | 0 | 0 | 0 | 1 |
| 0 | 1 | 0 | 1 | 0 | 1 |
| 0 | 1 | 1 | 0 | 1 | 1 |
| 1 | 0 | 0 | 0 | 1 | 0 |
| 1 | 0 | 0 | 1 | 1 | 1 |
| 1 | 0 | 1 | 0 | 1 | 0 |

PHASE DETECTION IN AN ANALOG CLOCK DATA RECOVERY CIRCUIT WITH DECISION FEEDBACK EQUALIZATION

BACKGROUND

Technical Field

The present invention relates generally to data communication links. More particularly, the present invention relates to phase detection in a clock-data recovery circuit with decision feedback equalization.

Description of the Background Art

High-speed serial interfaces may be used to communicate data between devices in a system. Such serial interfaces may provide a high data bandwidth across backplanes or between chip devices.

However, challenges and problems are faced due to the high-speed signaling that may be used by these serial interfaces. One challenge relates to obtaining sufficient timing error information for timing recovery in a high-speed transceiver with speculative decision feedback equalization (DFE).

SUMMARY

One embodiment of the invention relates to a method of phase detection in a receiver circuit with decision feedback equalization. Partial-equalization and full-equalization edge signals are generated. The feedback from the first tap of the decision feedback equalizer is separated from the feedback of the remaining plurality of taps. The feedback from the plurality of taps (not including the first tap) is used to generate partial-equalization edge signals, while the feedback from all the taps is used to generate full-equalization edge signals. The partial-equalization and full-equalization edge signals are utilized by phase-detection circuitry to provide highly-accurate data sampling locations for improved performance.

Other embodiments, aspects and features are also disclosed.

DETAILED DESCRIPTION

The present disclosure provides circuitry and methods for optimizing timing recovery performance in a high-speed transceiver with speculative decision feedback equalization. Data transmission reliability is substantially improved using the circuitry and methods disclosed herein.

Insufficient timing error information was used previously for timing recovery in a high-speed transceiver with speculative decision feedback equalization with an analog PLL based CDR. The use of such insufficient timing error information results in degradation of data transmission performance. This is because in an analog PLL based CDR, there are fewer options for adjusting the sampling location.

In accordance with an embodiment of the invention, timing error information in the signal is used from different zero-crossing locations to provide optimized data sampling positioning. Specific data pattern filtering is used for the timing error information processing. Decision multiplexing over a multiple symbol period is used to generate an appropriate signal for analog phase-locked loop (PLL) based clock-data recovery (CDR).

Advantageously, the circuits and methods disclosed herein substantially improve the performance of a high-speed transceiver with speculative DFE implemented. The data transmission reliability is improved due to better recovered signal quality and optimized data sampling positioning.

Figure 1:
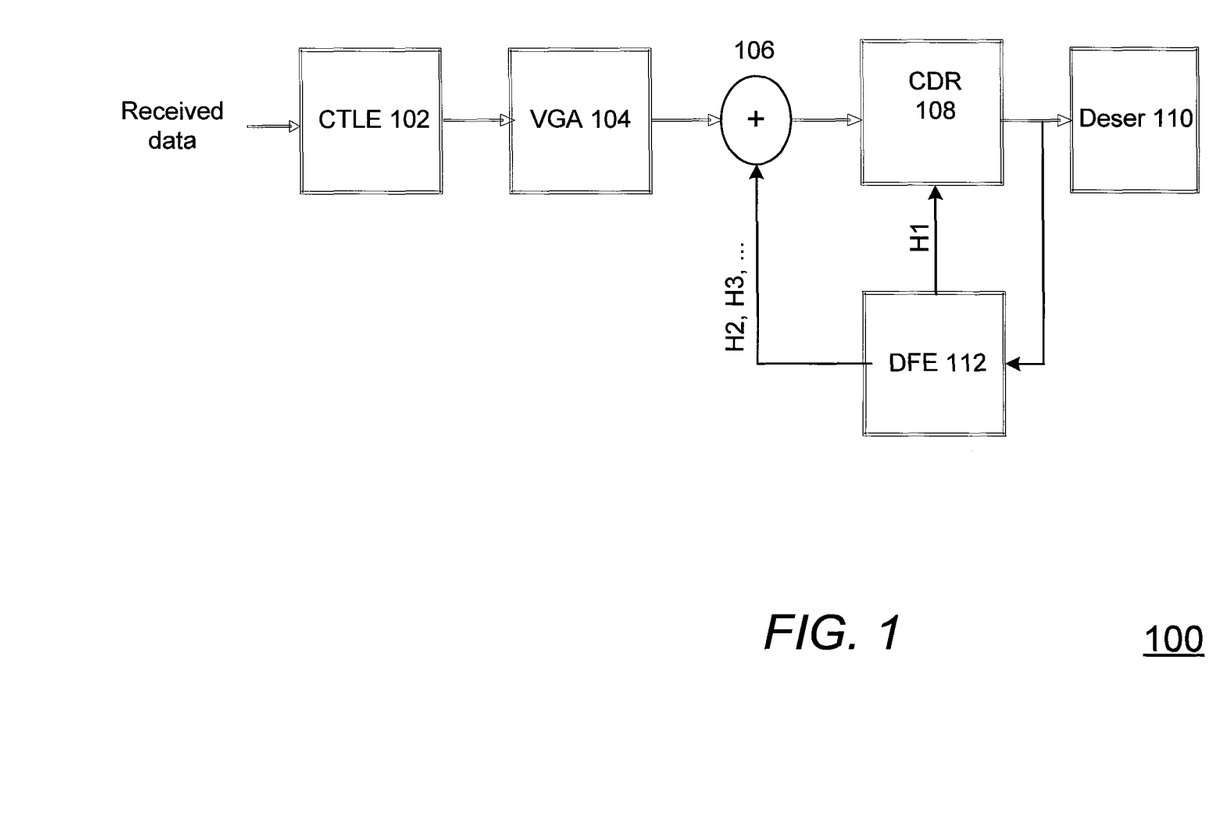
FIG. 1 is a high-level block diagram of an exemplary receiver circuit with speculative DFE in accordance with an embodiment of the invention.

FIG. 1 is a high-level block diagram of an exemplary receiver circuit 100 with speculative DFE in accordance with an embodiment of the invention. The exemplary receiver circuit is on an integrated circuit device and receives a data signal over a serial link from a partner integrated circuit device. As depicted, the receiver circuit 100 includes a continuous-time linear equalizer (CTLE) 102, a variable gain amplifier (VGA) 104, a summation circuitry 106, a clock-data recovery (CDR) loop circuit 108, a deserializer (Deser) circuit 110, and a decision feedback equalizer (DFE) circuit 112.

The CTLE 102 is an analog equalizer circuit that receives an analog serial data signal (received data) transmitted over a serial link from a transmitter circuit of the partner device. The CTLE 102 performs continuous-time (i.e. analog) linear equalization on the analog serial data signal.

The VGA 104 amplifies the analog data signal output from the CTLE 102. The output of the VGA 104 is summed with a feedback signal from the DFE circuit 112 by the summation circuitry 106 to generate an analog summation data signal, and the analog summation data signal from the summation circuitry 106 is provided to the CDR circuit 108.

The CDR circuit 108 recovers a clock signal from the analog summation data signal and provides the recovered clock signal to sampler (slicer) circuitry within the CDR circuit 108. The sampler circuitry samples the analog data signal (received data) in response to the recovered clock signal to obtain a digital data signal.

In accordance with an embodiment of the invention, a circuit structure within the CDR circuit 108 for phase detection and sampling is disclosed that effectively improves the accuracy of the data sampling locations. The disclosed circuit structure is described in detail below in relation to FIGS. 2, 3 and 4.

The deserializer circuit 110 receives and de-serializes the recovered (sampled) digital data signal from the CDR circuit

108 to obtain a parallel digital data signal. The parallel digital data signal may be provided to further circuitry in the integrated circuit for further processing and use.

The DFE circuit 112 also receives the recovered digital data signal output by the CDR circuit 108. In further accordance with an embodiment of the invention, the DFE circuit 112 provides a first tap signal (H1) to the CDR circuit 108 for use by the phase detection and sampling circuit structure and provides remaining tap signals (H2, H3, . . . ) as feedback to the summation node 106. In one implementation, the remaining tap signals include the ten tap signals from taps 2 through 11 (i.e. H2, H3, H4, . . . , H10, H11).

Figure 2:
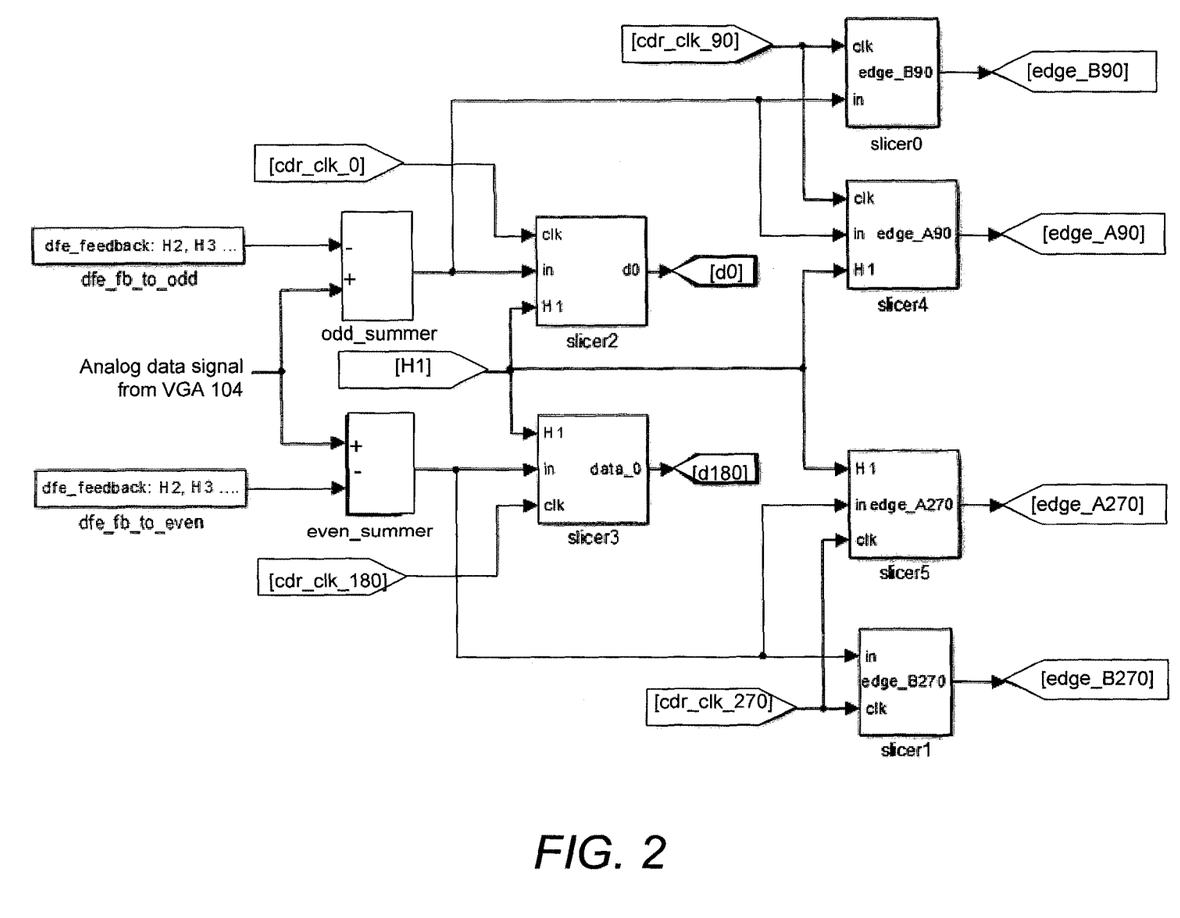
FIG. 2 shows exemplary circuitry for recovering data signals and generating edge signals in accordance with an embodiment of the invention.
Figure 3:
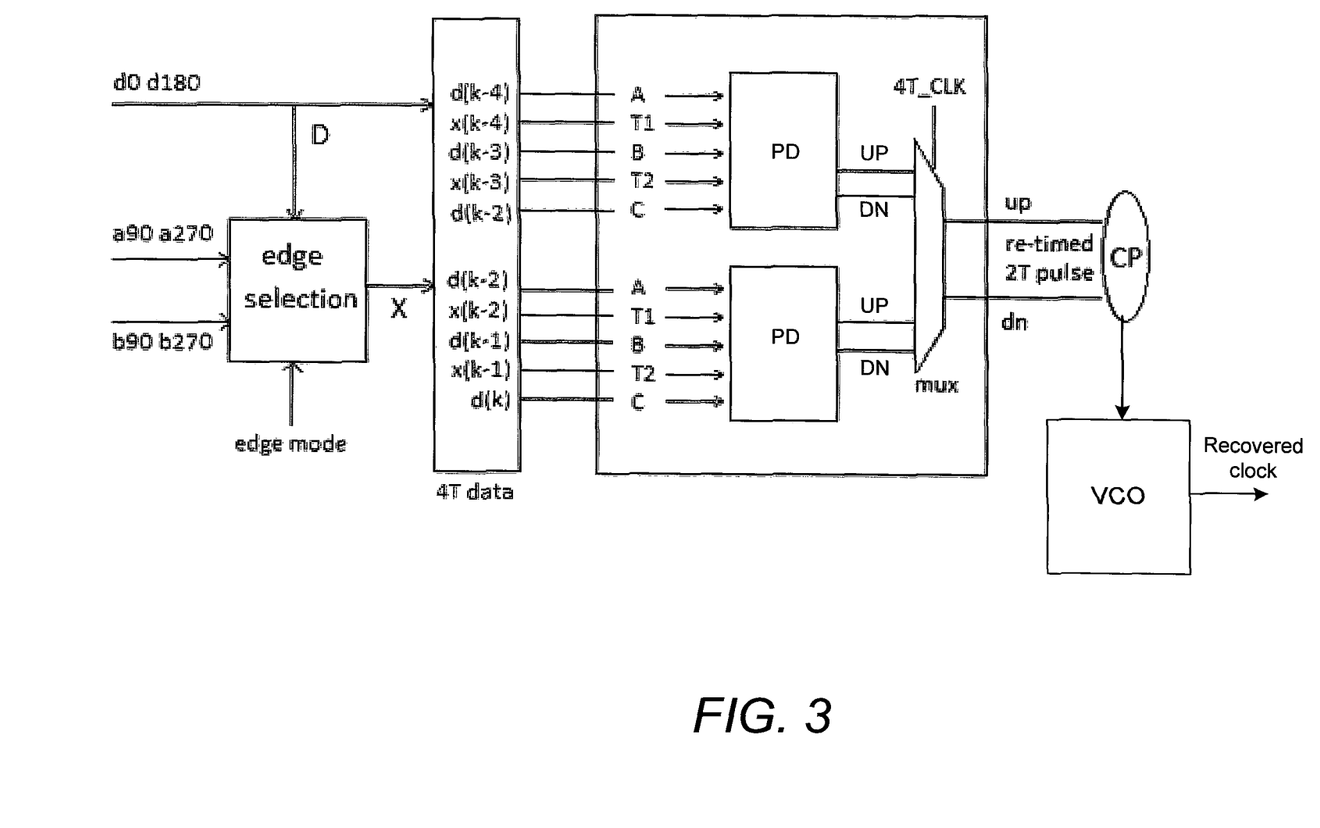
FIG. 3 shows exemplary circuit structure that uses the data and edge signals for phase detection for use in the clock data recovery (CDR) circuit in accordance with an embodiment of the invention.

FIGS. 2 and 3 depict exemplary circuitry for providing optimized phase detection in a clock-data recovery (CDR) circuit 108 with speculative DFE in accordance with an embodiment of the invention. FIG. 2 shows circuitry for recovering data signals and generating edge signals, and FIG. 3 shows circuitry that uses the data and edge signals for phase detection for use in the CDR circuit.

Referring to FIG. 2, an analog data signal may be received from the VGA circuit 104 at positive polarity inputs of odd and even summer circuits (odd_summer and even_summer). These odd and even summer circuits correspond to the summation circuit 106 in FIG. 1.

As further shown in FIG. 2, DFE feedback signals for odd data from DFE taps H2, H3, etc. (dfe_fb_to_odd) are provided to a negative polarity input of the odd summer circuit. Similarly, DFE feedback signals for even data from DFE taps H2, H3, etc. (dfe_fb_to_even) are provided to a negative polarity input of the even summer circuit. In other words, the DFE feedback signals from DFE taps, other than the first DFE tap (H1), are provided to negative polarity inputs of the odd and even summer circuits. The odd summer circuit subtracts the odd-data DFE feedback (for H2, H3, etc.) signals from the analog data signal so as to generate an odd-feedback partially-equalized data signal. The even summer circuit subtracts the even-data DFE feedback signals (for H2, H3, etc.) from the analog data signal so as to generate an even-feedback partially-equalized data signal.

Further shown in FIG. 2 are six sampler circuits (slicer0, slicer1, slicer2, slicer3, slicer4, and slicer5). These arrangement and operation of these six sampler circuits are described as follows.

A pair of data sampling circuits (slicer2 and slicer3) generate the even and odd data signals (d0 and d180, respectively). The slicer2 circuit subtracts the DFE feedback signal from the first DFE tap (H1) from the odd-feedback partially-equalized data signal (output from odd_summer) to generate a resultant odd-feedback fully-equalized data signal. The resultant odd-feedback fully-equalized data signal is sampled by the slicer2 circuit using the 0-degree recovered clock (cdr_clk_0) to obtain the even data signal (d0). Similarly, the slicer3 circuit subtracts the DFE feedback signal from the first DFE tap (H1) from the even-feedback partially-equalized data signal (output from even_summer) to generate a resultant even-feedback fully-equalized data signal. The resultant even-feedback fully-equalized data signal is sampled by the slicer3 circuit using the 180-degree recovered clock (cdr_clk_180) to obtain the odd data signal (d180). Together, these even and odd data signals form the recovered signal that may be output from the CDR circuit 108 to the deserializer circuit 110 in FIG. 1.

A pair of partial-equalization edge-generating sampling circuits (slicer0 and slicer1) sample the odd-feedback partially-equalized and even-feedback partially-equalized signals (outputs from odd_summer and even_summer, respectively) to generate a pair of partial-equalization edge signals (edge_B90 and edge_B270, respectively). The slicer0 circuit samples the odd-feedback partially-equalized signal (output from odd_summer) using the recovered 90-degree clock signal (cdr_clk_90) to obtain a 90-degree partially-equalized edge signal (edge_B90). Similarly, the slicer1 circuit samples the even-feedback partially-equalized signal (output from even_summer) using the recovered 270-degree clock signal (cdr_clk_270) to obtain a 270-degree partially-equalized edge signal (edge_B270).

A pair of full-equalization edge-generating sampling circuits (slicer4 and slicer5) generates a pair of full-equalization edge signals (edge_A90 and edge_A270, respectively). The slicer4 circuit subtracts the DFE feedback signal from the first DFE tap (H1) from the odd-feedback partially-equalized data signal (output from odd_summer) to generate a resultant odd-feedback fully-equalized data signal. The resultant odd-feedback fully-equalized data signal is sampled by the slicer4 circuit using the 90-degree recovered clock (cdr_clk_90) to obtain the 90-degree full-equalization edge signal (edge_A90). Similarly, the slicer5 circuit subtracts the DFE feedback signal from the first DFE tap (H1) from the even-feedback partially-equalized data signal (output from even_summer) to generate a resultant even-feedback fully-equalized data signal. The resultant even-feedback fully-equalized data signal is sampled by the slicer5 circuit using the 270-degree recovered clock (cdr_clk_270) to obtain the 270-degree full-equalization edge signal (edge_A270).

Referring to FIG. 3, the output signals of FIG. 2 correspond to the input signals in FIG. 3 (label in FIG. 2→label in FIG. 3) as follows: d0→d0; d180→d180; edge_A90→a90; edge_A270→a270; edge_B90→b90; and edge_B270→b270. The circuit structures depicted in FIG. 3 include: an edge selection circuit module; a 4T data module; two phase-detector (PD) logic modules; an output multiplexer (mux); a charge pump (CP) circuit; and a voltage-controlled oscillator (VCO).

The edge selection circuit module receives the data signals (d0 and d180) and the edge signals (a90, a270, b90 and b270). In an exemplary implementation, the edge selection circuit module may be in one of two modes, as controlled by the edge mode control signal.

When the edge mode control signal is logical one, then the edge selection control module outputs edge signals b90 and b270. In other words, in this mode, the output X includes the two partial-equalization edge signals. In this mode, power used may be reduced by powering down unused samplers (slicer4 and slicer 5 in FIG. 2) at the cost of less accurate timing error information (and so reduced performance). Hence, this mode may be referred to as a low-power mode.

When the edge mode control signal is logical zero, then the edge selection control module outputs the two partial-equalization edge signals b90 and b270 or the two full-equalization edge signals a90 and a270, depending on the values of the previous, current and next bits as indicated by data signals d0 and d180. If the previous, current and next bits are, respectively, 1, 0, and 1, or if they are, respectively, 0, 1, and 0, then the output X includes the two partial-equalization edge signals b90 and b270. On the other hand, if the previous, current and next bits are, respectively, 0, 0, and 1, or if they are, respectively, 1, 1, and 0, then the output X includes the two full-equalization signals a90 and a270. In this mode, timing error information may be more accurate (resulting in improved performance) at the cost of increased power consumption due to the use of the additional samplers (slicer4 and slicer 5 in FIG. 2). Hence, this mode may be referred to as a high-performance mode.

The 4T data module receives data input signals (D) and edge input signals (X). The data input signals (D) include the even and odd data signals d0 and d180, respectively. The edge input signals (X) are the signals output by the edge selection module and include either partial-equalization edge signals b90 and b270, or full-equalization edge signals a90 and a270, as described above. Every two clock cycles (i.e. every four bits of the data stream), the 4T data module loads four new data bits [d(k-3), d(k-2), d(k-1) and d(k)] and four new edge bits [x(k-4), x(k-3), x(k-2) and x(k-1)]. Based on these inputs (plus the previously input data bit d(k-4), the 4D data module outputs five binary signals (three data bits and two edge bits) to each phase-detector (PD) logic module.

The five binary signals provided to the lower PD logic module in FIG. 3 are: C=d(k); T2=x(k-1); B=d(k-1); T1=x(k-2); and A=d(k-2). The three data bits are as follows: d(k) is the kth (current) data bit; d(k-1) is the data bit before the kth data bit; and d(k-2) is the data bit that is two bits before the kth data bit. The two edge bits are as follows: x(k-1) is the edge bit that is sampled at the edge between d(k) and d(k-1); and x(k-2) is the edge bit that was sampled at the edge between d(k-1) and d(k-2).

For example, assume that at cycle k, d(k) is an even data bit from d0. In this case, d(k-1) is the odd data bit from d180 that precedes d(k) in the data bit stream, and d(k-2) is the even data bit from d0 that precedes d(k-1) in the data bit stream. In this case, x(k-1) is the edge bit from either a270 or b270 that was sampled at the edge between d(k-1) and d(k), and x(k-2) is the edge bit from either a90 or b90 that was sampled at the edge between d(k-2) and d(k-1).

As another example, assume that at cycle k, d(k) is an odd data bit from d180. In this case, d(k-1) is the even data bit from d0 that precedes d(k) in the data bit stream, and d(k-2) is the odd data bit from d180 that precedes d(k-1) in the data bit stream. In this case, x(k-1) is the edge bit from either a90 or b90 that was sampled at the edge between d(k-1) and d(k), and x(k-2) is the edge bit from either a270 or b270 that was sampled at the edge between d(k-2) and d(k-1).

Similarly, the five binary signals provided to the upper PD logic module in FIG. 3 are: C=d(k-2); T2=x(k-3); B=d(k-3); T1=x(k-4); and A=d(k-4). The three data bits are as follows: d(k-2) is the data bit that is two bits before the kth data bit; d(k-3) is the data bit that is three bits before the kth data bit; and d(k-4) is the data bit that is four bits before the kth data bit. The two edge bits are as follows: x(k-3) is the edge bit that was sampled at the edge between d(k-2) and d(k-3); and x(k-4) is the edge bit that was sampled at the edge between d(k-3) and d(k-4).

Figure 4:
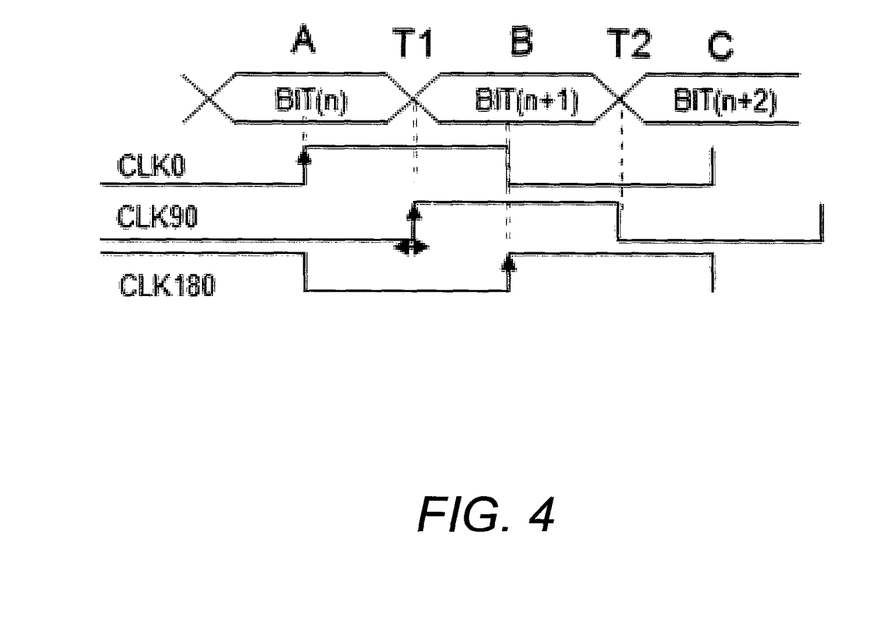
FIG. 4 is an example timing diagram depicting the three data signals and the two edge signals input to each phase-detector (PD) logic module in accordance with an embodiment of the invention.

FIG. 4 is an example timing diagram depicting the three data bit signals (A, B, and C) and the two edge bit signals (T1 and T2) input to each Phase-detector logic module in accordance with an embodiment of the invention. In this example, the first (A or Bit(n)) and third (C or Bit(n+2)) data bits are even data bits (from d0), and the second data bit, B or Bit(n+1), is an odd data bit (from d180). Further in this example, the first edge bit (T1) is the sampled edge (from either a90 or b90) between the first and second data bits, and the second edge bit (T2) is the sampled edge (from either a270 or b270) between the second and third data bits.

Figure 5A:
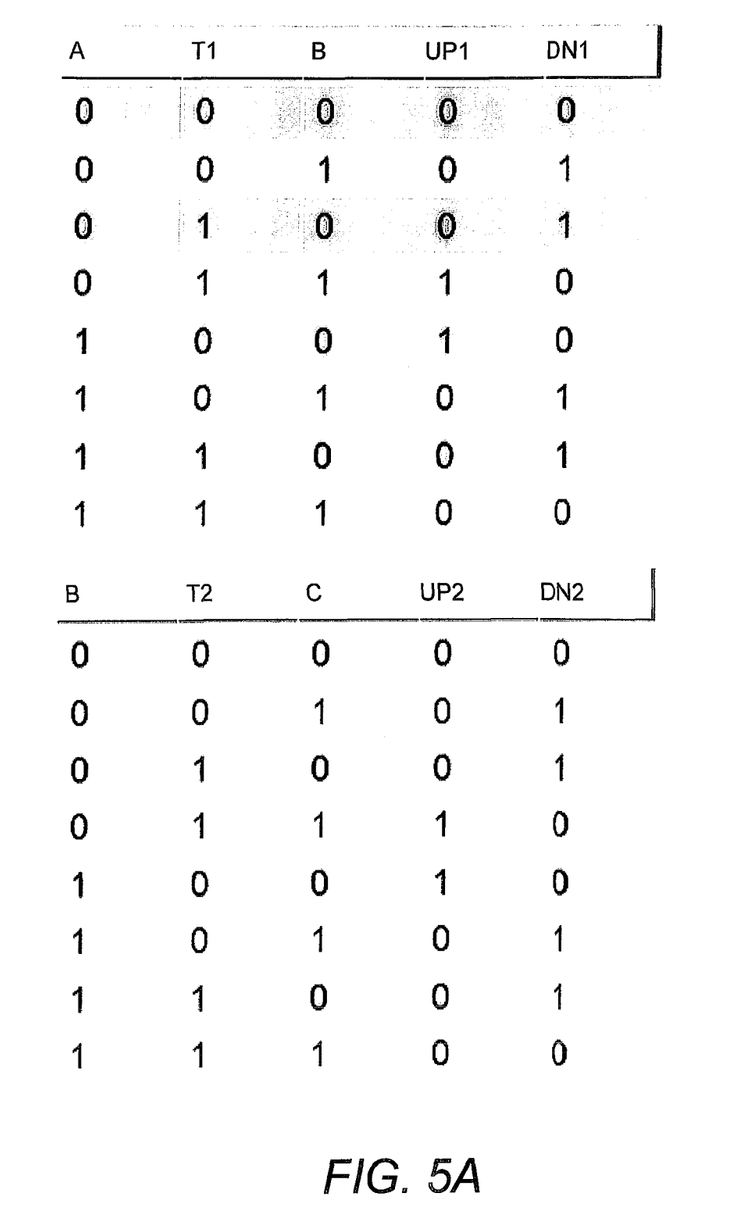
FIGS. 5A and 5B provide truth tables for each of the two phase-detector (PD) logic modules in accordance with an embodiment of the invention.
Figure 5B:
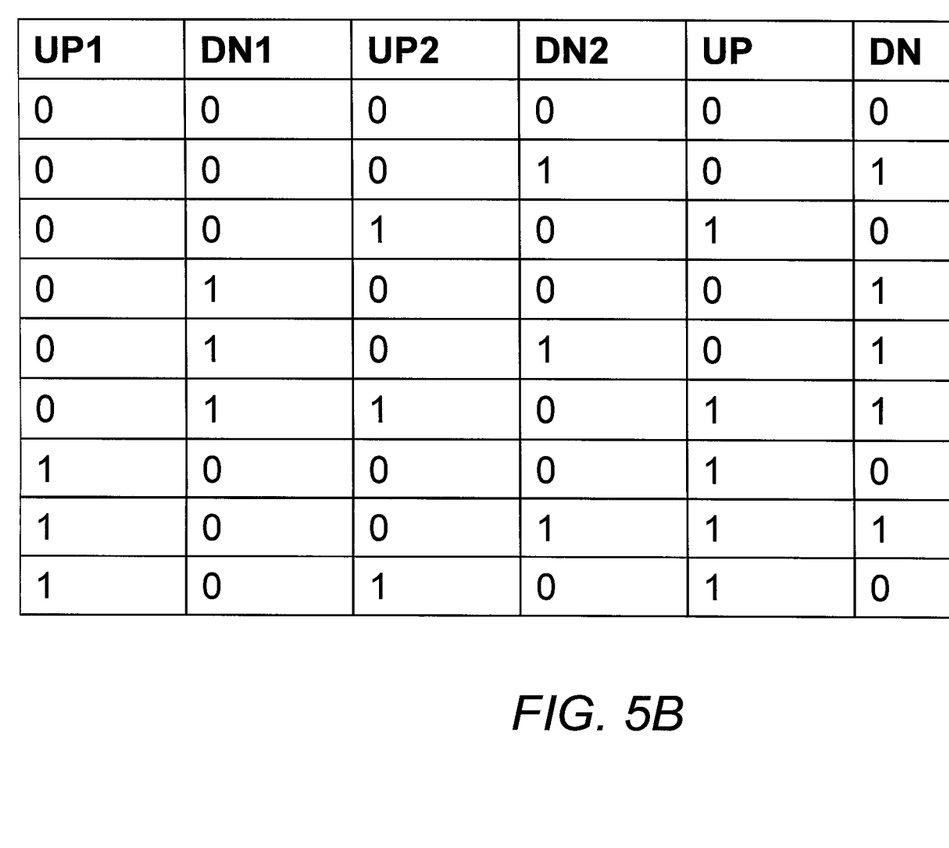

FIGS. 5A and 5B provide truth tables for each of the two phase-detector (PD) logic modules in accordance with an embodiment of the invention. Each PD logic module uses five binary inputs (A, T1, B, T2, and C) to generate four intermediate binary signals (UP1, DN1, UP2, and DN2), and uses the four intermediate binary signals to generate two binary outputs (UP and DN).

As shown by the two truth tables in FIG. 5A, a first pair of intermediate signals UP1 and DN1 depend on the input signals A, T1 and B, while a second pair of intermediate signals UP2 and DN2 depend on the input signals B, T2 and C.

As shown in the top truth table of FIG. 5A:
when A=0, T1=0, and B=0, then UP1=0 and DN1=0;
when A=0, T1=0, and B=0, then UP1=0 and DN1=0;
when A=0, T1=0, and B=1, then UP1=0 and DN1=1;
when A=0, T1=1, and B=0, then UP1=0 and DN1=1;
when A=0, T1=1, and B=1, then UP1=1 and DN1=0;
when A=1, T1=0, and B=0, then UP1=1 and DN1=0;
when A=1, T1=0, and B=1, then UP1=0 and DN1=1;
when A=1, T1=1, and B=0, then UP1=0 and DN1=1; and
when A=1, T1=1, and B=1, then UP1=0 and DN1=0.

As shown in the bottom truth table of FIG. 5A:
when B=0, T2=0, and C=0, then UP2=0 and DN2=0;
when B=0, T2=0, and C=0, then UP2=0 and DN2=0;
when B=0, T2=0, and C=1, then UP2=0 and DN2=1;
when B=0, T2=1, and C=0, then UP2=0 and DN2=1;
when B=0, T2=1, and C=1, then UP2=1 and DN2=0;
when B=1, T2=0, and C=0, then UP2=1 and DN2=0;
when B=1, T2=0, and C=1, then UP2=0 and DN2=1;
when B=1, T2=1, and C=0, then UP2=0 and DN2=1; and
when B=1, T2=1, and C=1, then UP2=0 and DN2=0.

As shown by the truth table in FIG. 5B, the pair output signals (UP and DN) depend on the four intermediate signals (UP1, DN1, UP2 and DN2). In particular, as shown in the truth table of FIG. 5B:
when UP1=0, DN1=0, UP2=0 and DN2=0, then UP=0 and DN=0;
when UP1=0, DN1=0, UP2=0 and DN2=1, then UP=0 and DN=1;
when UP1=0, DN1=0, UP2=1 and DN2=0, then UP=1 and DN=0;
when UP1=0, DN1=1, UP2=0 and DN2=0, then UP=0 and DN=1;
when UP1=0, DN1=1, UP2=0 and DN2=1, then UP=0 and DN=1;
when UP1=0, DN1=1, UP2=1 and DN2=0, then UP=1 and DN=1;
when UP1=1, DN1=0, UP2=0 and DN2=0, then UP=1 and DN=0;
when UP1=1, DN1=0, UP2=0 and DN2=1, then UP=1 and DN=1; and
when UP1=1, DN1=0, UP2=1 and DN2=0, then UP=1 and DN=0.

Referring back to FIG. 3, the output multiplexer (mux) receives a first pair of UP and DN signals from the lower PD logic module and a second pair of UP and DN signals from the upper logic module. The output multiplexer is driven by the 4T_CLK which has a clock period that is twice as long as the recovered clock signal.

During one edge (for example, the rising edge) of 4T_CLK, the output multiplexer may switch the UP and DN signals from the lower PD logic module to be the output signals up and dn, respectively. During the other edge (for example, the falling edge) of 4T_CLK, the output multiplexer may switch the UP and DN signals from the upper PD logic module to be the output signals up and dn, respectively.

As further shown in FIG. 3, the up and dn output signals from the output multiplexer may be provided to the charge pump (CP) circuit, and the output from the charge pump may be provided to a voltage-controlled oscillator (VCO). The VCO may generate the recovered (0-degree) clock signal (cdr_clk_0). Note that the 90-degree, 180-degree, and 270-degree clock signals (cdr_clk_90, cdr_clk_180, and cdr_clk_270, respectively) may be obtained from the recovered clock signal. For example, 90-degree, 180-degree, and 270-degree phase delays may be applied to the recovered clock signal.

Figure 6A:
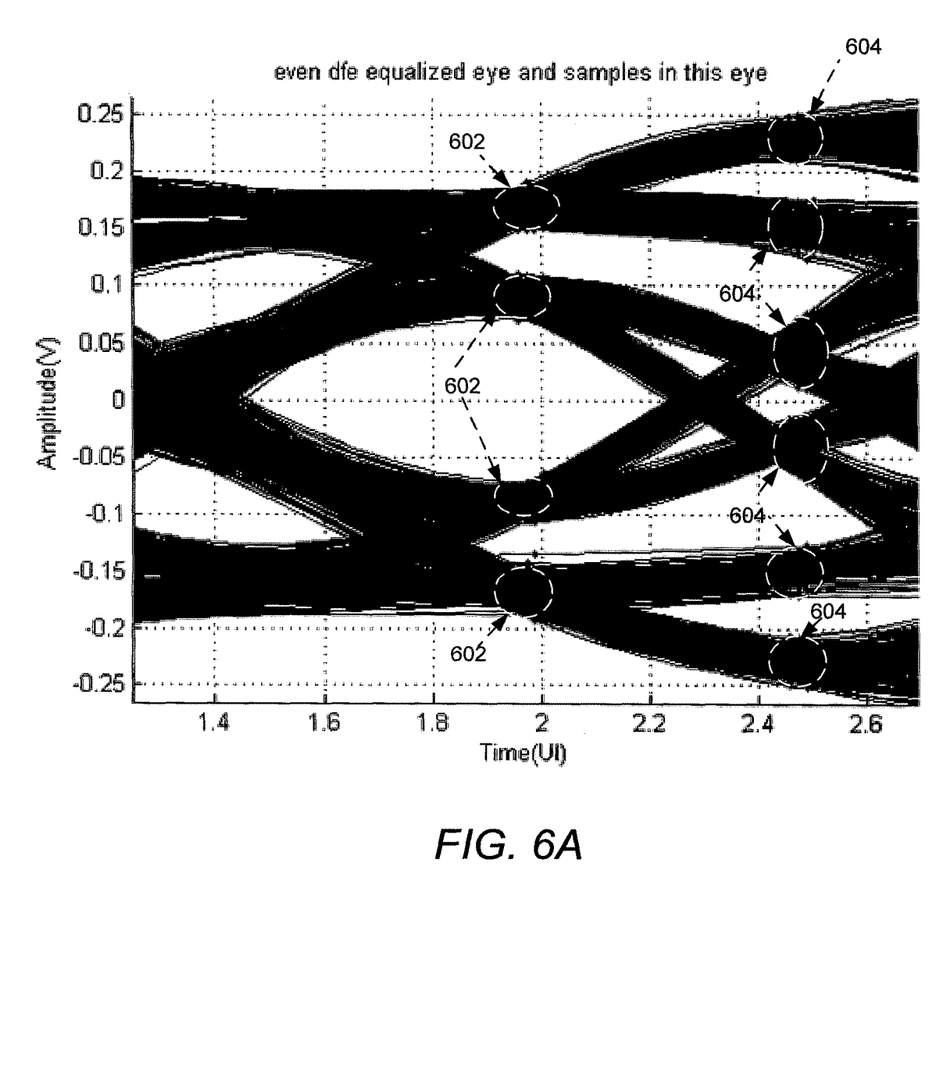
FIG. 6A depicts an eye diagram and data sampling locations using a receiver circuit with speculative DFE and conventional phase detection.

FIG. 6A depicts an eye diagram and data sampling locations using a receiver circuit with speculative DFE and conventional phase detection. In particular, the eye diagram is for an even DFE-equalized data signal. Data sampling locations 602 using conventional bang-bang phase detection are shown, along with the conventional bang-bang CDR locked locations 604.

As seen, the data sampling locations in FIG. 6A are biased to the right side of the equalized eye. This disadvantageously reduces the margin of error and may result in difficulty in achieving a very low bit error rate (BER), such as a BER smaller than $10^{-12}$.

Figure 6B:
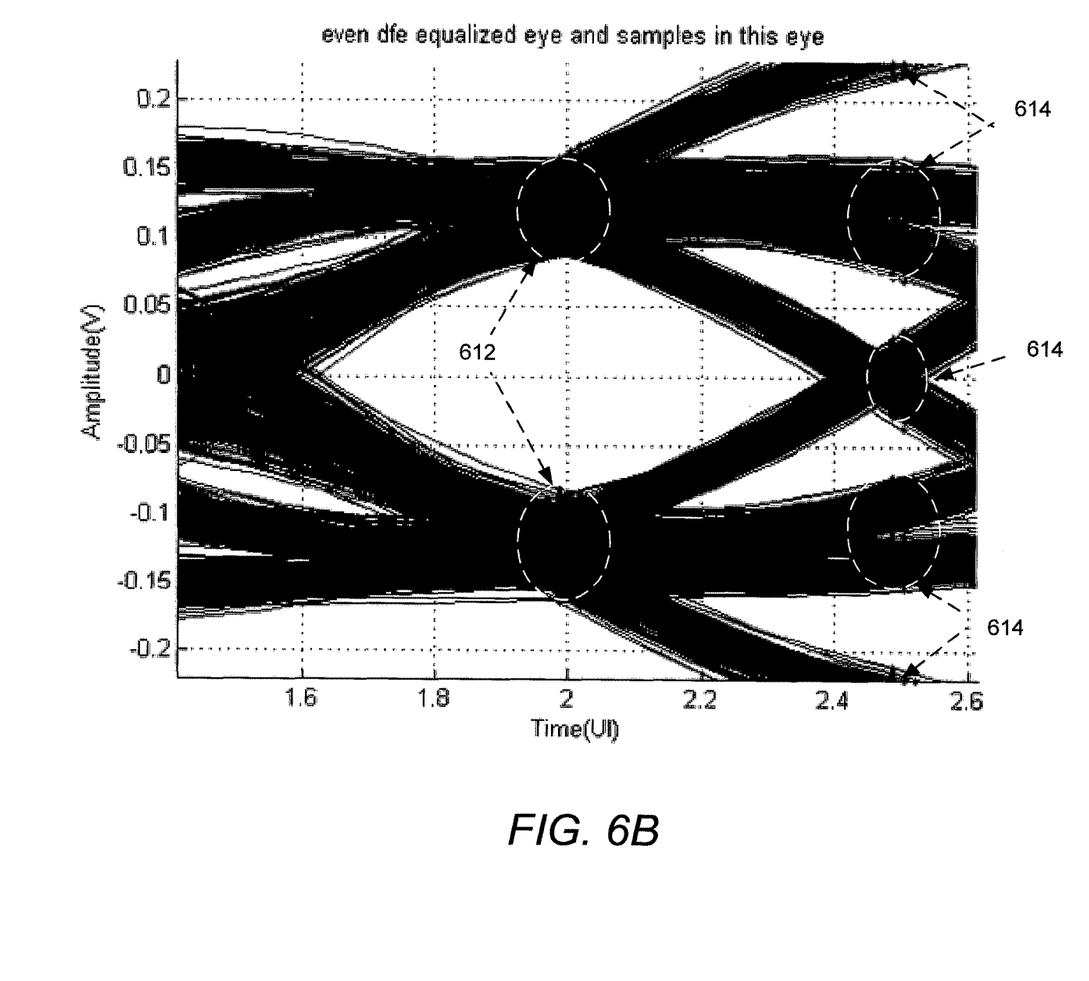
FIG. 6B depicts an eye diagram and data sampling locations using a receiver circuit with speculative DFE and optimized phase detection in accordance with an embodiment of the invention.

FIG. 6B depicts an eye diagram and data sampling locations using a receiver circuit with speculative DFE and optimized phase detection in accordance with an embodiment of the invention. As in FIG. 6A, the eye diagram of FIG. 6B is for an even DFE-equalized data signal. Data sampling locations 612 using the phase detection circuitry disclosed herein are shown, along with improved bang-bang CDR locked locations 614.

As seen, the data sampling locations 612 in FIG. 6B are at the center of the equalized eye. This advantageously increases the margin of error (both horizontal and vertical) and so supports the achievement of a lower BER, such as a BER smaller than $10^{-12}$.

Figure 7:
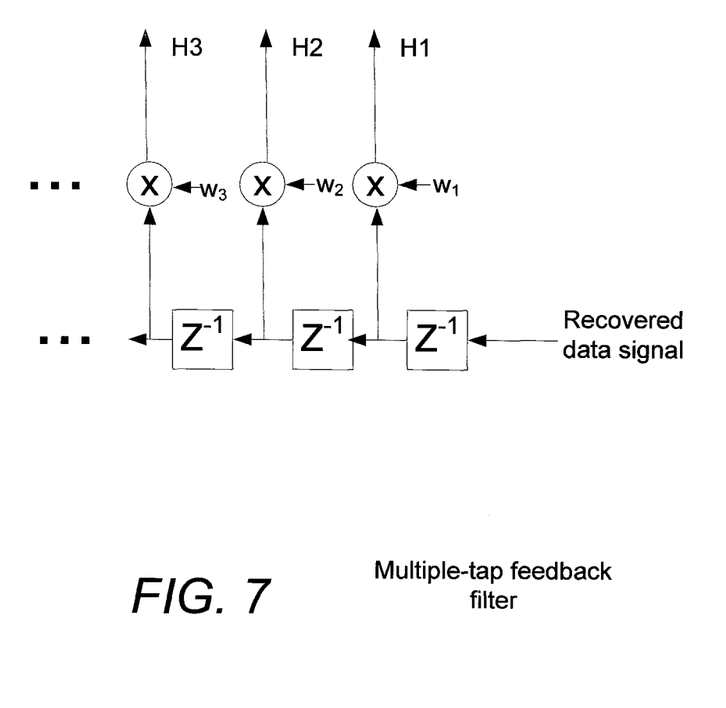
FIG. 7 depicts a multi-tap feedback filter for decision feedback equalization in accordance with an embodiment of the invention.

FIG. 7 depicts a multi-tap feedback filter for decision feedback equalization in accordance with an embodiment of the invention. The multi-tap feedback filter of FIG. 7 is an example of circuitry that may be part of DFE circuit 112 of FIG. 1. As illustrated, the recovered data signal may be fed back and input into a multiple-stage tapped delay line of an exemplary filter structure. Each $Z^{-1}$ delay is a unit delay circuit.

After the first unit delay, the data signal is weighted by tap weight $w_1$, and the result is provided as the first tap output H1. After the second unit delay, the data signal is weighted by tap weight $w_2$, and the result is provided as the second tap output H2. After the third unit delay, the data signal is weighted by tap weight $w_3$, and the result is provided as the third tap output H3. And so on for further tap outputs. In this way, a set of tap outputs may be produced.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc.

In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize. These modifications may be made to the invention in light of the above detailed description.

What is claimed is:

1. A circuit for phase detection, the circuit comprising:
   a first summer circuit that subtracts odd-data feedback signals from a plurality of taps of a decision feedback equalizer from an analog data signal to obtain an odd-feedback partially-equalized data signal;
   a first sampling circuit that samples the odd-feedback partially-equalized data signal using a first quadrature clock signal to generate a first partial-equalization edge signal;
   a second sampling circuit that subtracts a feedback signal from a first tap of the decision feedback equalizer from the odd-feedback partially-equalized data signal to obtain an odd-feedback fully-equalized data signal and samples the odd-feedback fully-equalized data signal using the first quadrature clock signal to generate a first full-equalization edge signal;
   a second summer circuit that subtracts even-data feedback signals from the plurality of taps of the decision feedback equalizer from the analog data signal to obtain an even-feedback partially-equalized data signal;
   a third sampling circuit that samples the even-feedback partially-equalized data signal using a second quadrature clock signal to generate a second partial-equalization edge signal;
   a fourth sampling circuit that subtracts the feedback signal from the first tap of the decision feedback equalizer from the even-feedback partially-equalized data signal to obtain an even-feedback fully-equalized data signal and samples the even-feedback fully-equalized data signal using the second quadrature clock signal to generate a second full-equalization edge signal; and
   a fifth sampling circuit that subtracts the feedback signal from the first tap of the decision feedback equalizer from the odd-feedback partially-equalized data signal to obtain the odd-feedback fully-equalized data signal and samples the odd-feedback fully-equalized data signal using a third quadrature clock signal to generate an even data signal.

2. The circuit of claim 1, wherein the plurality of taps of the decision feedback equalizer does not include the first tap of the decision feedback equalizer.

3. The circuit of claim 1, wherein the plurality of taps of the decision feedback equalizer does not include the first tap of the decision feedback equalizer, and wherein the first quadrature clock signal and the second quadrature clock signal are phase shifted from each other by 180 degrees.

4. The circuit of claim 1, further comprising:
   a sixth sampling circuit that subtracts the feedback signal from the first tap of the decision feedback equalizer from the even-feedback partially-equalized data signal to obtain the even-feedback fully-equalized data signal and samples the even-feedback fully-equalized data signal using a fourth quadrature clock signal to generate an odd data signal.

5. The circuit of claim 4, wherein the first quadrature clock signal and the second quadrature clock signal are phase shifted from each other by 180 degrees, and wherein the third quadrature clock signal and the fourth quadrature clock signal are phase-shifted from each other by 180 degrees, and wherein the first quadrature clock is phase shifted from the third quadrature clock by 90 degrees.

6. The circuit of claim 4, wherein the first quadrature clock signal is a recovered clock signal phase shifted by 90 degrees, the second quadrature clock signal is the recovered clock signal phase shifted by 270 degrees, the third quadrature clock signal is the recovered clock signal, and the fourth quadrature clock signal is the recovered clock signal phase shifted by 180 degrees.

7. The circuit of claim 4, further comprising:
an edge selection circuit that uses the even and odd data signals to select a pair of edge signal comprising either the first and second partial-equalization edge signals, or the first and second full-equalization edge signals.

8. The circuit of claim 4, further comprising:
a data module that receives the even and odd data signals and the pair of edge signals;
a first phase-detection logic circuit that receives a first set of binary data and edge signals from the data module and outputs a first pair of up-down signals; and
a second phase-detection logic circuit that receives a second set of binary data and edge signals from the data module and outputs a second pair of up-down signals.

9. The circuit of claim 8, further comprising:
a multiplexer that selects the first pair of up-down signals and the second pair of up-down signals in alternation.

10. The circuit of claim 1, wherein the circuit is in a clock-data recovery circuit of a receiver circuit on an integrated circuit device.

11. A method of phase detection in a receiver circuit with decision feedback equalization, the method comprising:
subtracting odd-data decision feedback signals from a plurality of taps of a decision feedback equalizer from an analog data signal to obtain an odd-feedback partially-equalized data signal, wherein the plurality of taps of the decision feedback equalizer does not include a first tap of the decision feedback equalizer;
sampling the odd-feedback partially-equalized data signal using a first clock signal to generate a first partial-equalization edge signal;
subtracting a decision feedback signal of the first tap of the decision feedback equalizer from the odd-feedback partially-equalized data signal to obtain an odd-feedback fully-equalized data signal;
sampling the odd-feedback fully-equalized data signal using the first clock signal to generate a first full-equalization edge signal;
subtracting even-data feedback signals from the plurality of taps of the decision feedback equalizer from the analog data signal to obtain an even-feedback partially-equalized data signal;
sampling the even-feedback partially-equalized data signal using a second clock signal to generate a second partial-equalization edge signal;
subtracting the feedback signal from the first tap of the decision feedback equalizer from the even-feedback partially-equalized data signal to obtain an even-feedback fully-equalized data signal;
sampling the even-feedback fully-equalized data signal using the second clock signal to generate a second full-equalization edge signal,
subtracting the feedback signal from the first tap of the decision feedback equalizer from the odd-feedback partially-equalized data signal to obtain an odd-feedback fully-equalized data signal;
sampling the odd-feedback fully-equalized data signal using a third clock signal to generate an even data signal;
subtracting the feedback signal from the first tap of the decision feedback equalizer from the even-feedback partially-equalized data signal to obtain an even-feedback fully-equalized data signal; and
sampling the even-feedback fully-equalized data signal using a fourth clock signal to generate an odd data signal,
wherein the first clock signal and the second clock signal are phase shifted from each other by 180 degrees, and wherein the third clock signal and the fourth clock signal are phase-shifted from each other by 180 degrees.

12. The method of claim 11, wherein the first clock signal is a recovered clock signal phase shifted by 90 degrees, the second clock signal is the recovered clock signal phase shifted by 270 degrees, the third clock signal is the recovered clock signal phase shifted by 0 degrees, and the fourth clock signal is the recovered clock signal phase shifted by 13 degrees.

13. The method of claim 12, further comprising:
using the even and odd data signals, the first partial-equalization edge signal, and the first full-equalization edge signal, the second partial-equalization edge signal, and the second full-equalization edge signal to generate an up-down signal that is output to a charge pump circuit in a clock-data recovery circuit.

14. A receiver circuit of a serial interface, the receiver circuit comprising:
an odd summer circuit that subtracts odd-data feedback signals from a plurality of taps of a decision feedback equalizer from an analog data signal to obtain an odd-feedback partially-equalized data signal, wherein the plurality of taps does not include a first tap of the decision feedback equalizer;
a first sampling circuit that samples the odd-feedback partially-equalized data signal using a first quadrature clock signal to generate a first partial-equalization edge signal, wherein the first quadrature clock signal is a recovered clock signal phase shifted by 90 degrees;
a second sampling circuit that subtracts the feedback signal of the first tap of the decision feedback equalizer from the odd-feedback partially-equalized data signal to obtain an odd-feedback fully-equalized data signal and samples the odd-feedback fully-equalized data signal using the first quadrature clock signal to generate a first full-equalization edge signal;
a second summer circuit that subtracts even-data feedback signals from the plurality of taps of the decision feedback equalizer from the analog data signal to obtain an even-feedback partially-equalized data signal;
a third sampling circuit that samples the even-feedback partially-equalized data signal using a second quadrature clock signal to generate a second partial-equalization edge signal, wherein the second quadrature clock signal is the recovered clock signal phase shifted by 270 degrees; and
a fourth sampling circuit that subtracts the feedback signal from the first tap of the decision feedback equalizer from the even-feedback partially-equalized data signal to obtain an even-feedback fully-equalized data signal and samples the even-feedback fully-equalized data signal using the second quadrature clock signal to generate a second full-equalization edge signal.

15. The receiver circuit of claim 14, further comprising:
a fifth sampling circuit that subtracts the feedback signal from the first tap of the decision feedback equalizer from the odd-feedback partially-equalized data signal to obtain an odd-feedback fully-equalized data signal and samples the odd-feedback fully-equalized data signal using a third quadrature clock signal to generate an even data signal, wherein the third quadrature clock signal is the recovered clock signal; and
a sixth sampling circuit that subtracts the feedback signal from the first tap of the decision feedback equalizer from the even-feedback partially-equalized data signal to obtain an even-feedback fully-equalized data signal and samples the even-feedback fully-equalized data signal using a fourth quadrature clock signal to generate an odd data signal, the fourth quadrature clock signal is the recovered clock signal phase shifted by 180 degrees.

16. The receiver circuit of claim 15, further comprising: phase-detection circuitry that uses the even and odd data signals, the first partial-equalization edge signal, and the first full-equalization edge signal, the second partial-equalization edge signal, and the second full-equalization edge signal to generate an up-down signal that is output to a charge-pump circuit in a clock-data recovery circuit.

\* \* \* \* \*